United States Patent
Partovi et al.

(10) Patent No.: US 7,061,337 B2
(45) Date of Patent: Jun. 13, 2006

(54) AMPLITUDE CONTROL CIRCUIT

(75) Inventors: Hamid Partovi, Sunnyvale, CA (US); Sivaraman Chokkalingam, San Jose, CA (US); Karthik Gopalakrishnan, San Jose, CA (US)

(73) Assignee: Infineon Technologies AG, Munich (DE)

( * ) Notice: Subject to any disclaimer, the term of this patent is extended or adjusted under 35 U.S.C. 154(b) by 16 days.

(21) Appl. No.: 10/890,764

(22) Filed: Jul. 14, 2004

(65) Prior Publication Data

US 2006/0012447 A1    Jan. 19, 2006

(51) Int. Cl.
*H03B 5/12* (2006.01)
*H03L 1/00* (2006.01)
*H03L 5/00* (2006.01)

(52) U.S. Cl. .............. 331/109; 331/177 V; 331/183; 331/186

(58) Field of Classification Search ............. 331/109, 331/116 R, 116 FE, 117 R, 117 FE, 117 D, 331/177 R, 177 V, 182–183, 185–186
See application file for complete search history.

(56) References Cited

U.S. PATENT DOCUMENTS

| | | | |
|---|---|---|---|
| 5,635,876 A | 6/1997 | Gerrits et al. | |
| 5,714,911 A | 2/1998 | Gilbert | |
| 5,818,306 A | 10/1998 | Lee et al. | |
| 6,653,908 B1 | 11/2003 | Jones | |
| 6,680,655 B1 * | 1/2004 | Rogers | 331/109 |
| 6,812,802 B1 * | 11/2004 | Godambe et al. | 331/183 |
| 6,838,952 B1 * | 1/2005 | Ramet | 331/183 |

OTHER PUBLICATIONS

Hitko and Sodini, "Adaptive Biasing of a 5.8GHz CMOS Oscillator", ISSC Digest of Tech Papers, Feb. 2002; 9 pps.
Margarit, "A Low-Noise Low-Power VCO with Automatic Amplitude Control for Wireless Applications"; J Solid State Circuits, Jun. 1999, 11 pps.

* cited by examiner

*Primary Examiner*—David Mis
(74) *Attorney, Agent, or Firm*—Dicke, Billing & Czaja, PLLC

(57) ABSTRACT

An amplitude control circuit comprises a first circuit configured to receive differential signals and provide a first signal based on the amplitudes of the differential signals, a second circuit configured to receive a bias signal and provide a second signal based on the bias signal, and a third circuit configured to provide bias to the first circuit and the bias signal to the second circuit. The bias signal is set to provide selected amplitudes of the differential signals.

39 Claims, 8 Drawing Sheets

AMPLITUDE CONTROL CIRCUIT

BACKGROUND

Amplitude control circuits (ACC's) control the power provided and processed by systems. Also, ACC's can allow systems to adapt to changeable operating environments and signal dynamics. ACC's can be used in any suitable system, such as a communications system, a process control system, test equipment, and an audio control system. For example, in a communications system, amplitude control at a receiver ensures a constant amplitude level is provided to a demodulator. Also, amplitude control at a transmitter aids in reducing the dynamic range requirements of the receiver.

Many systems, such as communication systems and audio control systems, include at least one voltage controlled oscillator (VCO). A VCO provides a selected oscillating frequency that can be adjusted with a control signal. Typically, the control signal alters a component value, such as a capacitance value, to change the oscillation frequency. An ACC coupled to a VCO controls the amplitude of the oscillating output signals. VCO's can be used in any suitable system, such as a portable communications system.

Typically, VCO's in portable communication systems are built to provide low phase-noise levels while consuming minimal power. To achieve these goals, manufacturers have developed VCO's in complementary metal oxide semiconductor (CMOS) technology. In one CMOS VCO including an ACC, the ACC provides current to the VCO without feedback from the differential output signals of the VCO. The results are process dependent. Also, bipolar junction transistor VCO's including an ACC do not transfer well to CMOS technology and further, to low voltage CMOS technology.

For these and other reasons there is a need for the present invention.

SUMMARY

One aspect of the present invention provides an amplitude control circuit comprising a first circuit configured to receive differential signals and provide a first signal based on the amplitudes of the differential signals, a second circuit configured to receive a bias signal and provide a second signal based on the bias signal, and a third circuit configured to provide bias to the first circuit and the bias signal to the second circuit. The bias signal is set to provide selected amplitudes of the differential signals.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
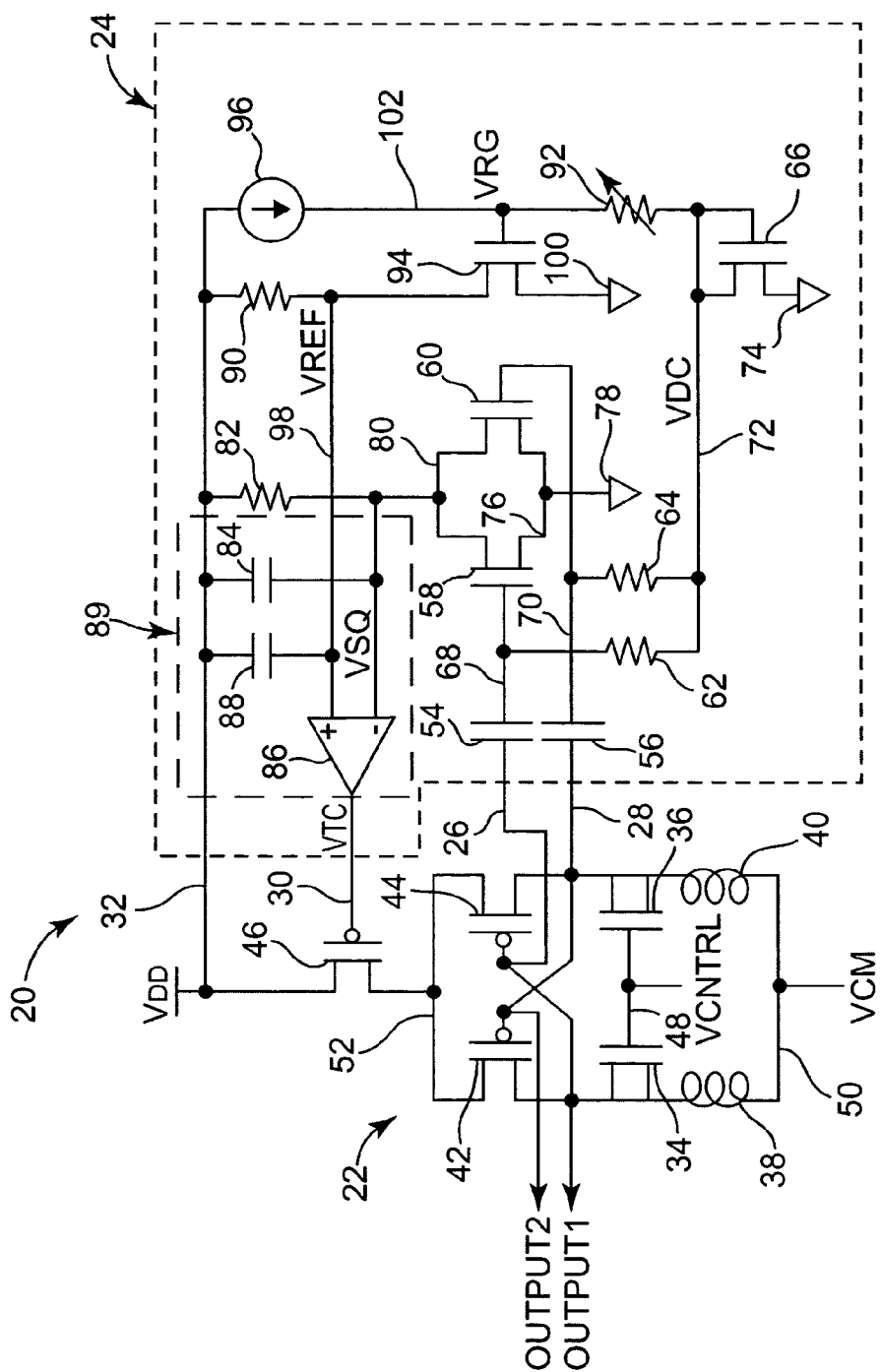
FIG. 1 is a diagram illustrating one embodiment of an amplitude control circuit in one embodiment of a voltage controlled oscillator.

FIG. 1 is a diagram illustrating one embodiment of an amplitude control circuit (ACC) 24 in one embodiment of a voltage controlled oscillator (VCO) 20. VCO 20 includes a VCO core 22 and ACC 24. VCO core 22 is electrically coupled to ACC 24 via output conductors 26 and 28 and tail current bias conductor 30. Also, VCO core 22 and ACC 24 are electrically coupled to power supply voltage VDD via power conductive path 32.

ACC 24 receives differential output signals from VCO core 22 via output conductors 26 and 28. The differential output signals oscillate out of phase with each other. Each of the differential output signals biases one transistor in a differential pair of transistors. The filtered output of the differential pair of transistors includes a direct current (DC) component that is related to the amplitudes of the differential output signals. The DC component of the filtered output is compared to a programmable reference voltage to control the tail current of VCO core 22 and the amplitudes of the differential output signals. In other embodiments, ACC 24 can be used in any suitable circuit to control the amplitudes of signals received from the circuit.

VCO core 22 includes n-channel metal oxide semiconductor (NMOS) varactors 34 and 36, inductors 38 and 40, and p-channel metal oxide semiconductor (PMOS) transistors 42, 44, and 46. The gate of varactor 34 is electrically coupled to the gate of varactor 36 via control signal path 48. The drain and source of varactor 34 are electrically coupled together and to one terminal of inductor 38 via output conductor 26. Also, the drain and source of varactor 36 are electrically coupled together and to one terminal of inductor 40 via output conductor 28. The other terminal of inductor 38 is electrically coupled to the other terminal of inductor 40 via common mode signal path 50.

Varactors 34 and 36 and inductors 38 and 40 oscillate at a resonant frequency based on the capacitance values of varactors 34 and 36 and the inductance values of inductors 38 and 40. The capacitance values of varactors 34 and 36 are controlled by a control voltage VCNTRL on control signal path 48. The control voltage VCNTRL controls the oscillating frequency of VCO core 22 via varactors 34 and 36. A common mode voltage VCM is provided for bias on common mode signal path 50. Transistors 42, 44, and 46 provide a negative resistance to cancel energy losses presented by the oscillating varactors 34 and 36 and inductors 38 and 40 and to set the amplitudes of output signals OUTPUT1 and OUTPUT2 on output conductors 26 and 28.

The drain and source of varactor 34 is electrically coupled to the drain-source path of transistor 42 and to the gate of transistor 44 via output conductor 26. The drain and source of varactor 36 is electrically coupled to the drain-source path of transistor 44 and to the gate of transistor 42 via output conductor 28. Also, the drain-source paths of transistors 42 and 44 are electrically coupled together and to the drain-source path of transistor 46 via tail current conductive path 52. The other side of the drain-source path of transistor 46 is electrically coupled to power supply voltage VDD via power conductive path 32. The gate of transistor 46 is electrically coupled to ACC 24 via tail current bias conductor 30.

VCO core 22 oscillates to provide oscillating differential output signals OUTPUT1 and OUTPUT2 on output conductors 26 and 28, respectively. ACC 24 provides a tail current bias voltage VTC on tail current bias conductor 30 to control the amount of current flowing through transistor 46. The current flowing through transistor 46 is provided to varactors 34 and 36 and inductors 38 and 40 to replace lost energy and set the amplitudes of output signals OUTPUT1 and OUTPUT2 on output conductors 26 and 28.

In operation of VCO core 22, when output signal OUTPUT1 is high relative to output signal OUTPUT2, transistor 44 is biased to conduct less current and transistor 42 is biased to conduct more current. Current flowing through transistor 46 charges output conductor 26 through transistor 42. The amplitude of output signal OUTPUT1 on output conductor 26 is related to the amplitude of the current flowing through transistor 46. Larger current amplitudes provide larger output signal OUTPUT1 amplitudes. Smaller current amplitudes provide smaller output signal OUTPUT1 amplitudes.

As VCO core 22 oscillates, output conductor 26 discharges and output conductor 28 charges to provide a low output signal OUTPUT1 relative to output signal OUTPUT2. Transistor 44 is biased to conduct more current and transistor 42 is biased to conduct less current. Current flowing through transistor 46 charges output conductor 28 through transistor 44. The amplitude of output signal OUTPUT2 on output conductor 28 is related to the amplitude of the current flowing through transistor 46. Larger current amplitudes provide larger output signal OUTPUT2 amplitudes. Smaller current amplitudes provide smaller output signal OUTPUT2 amplitudes. ACC 24 receives the output signals OUTPUT1 and OUTPUT2 and, in a feedback loop, provides the tail current bias voltage VTC to regulate the current flowing through transistor 46 and the amplitudes of output signals OUTPUT1 and OUTPUT2.

To receive output signals OUTPUT1 and OUTPUT2, ACC 24 includes DC blocking capacitors 54 and 56 coupled to an NMOS differential pair of transistors 58 and 60 and to resistors 62 and 64 that are coupled to NMOS transistor 66. One side or terminal of capacitor 54 is electrically coupled to VCO core 22 via output conductor 26, and one side or terminal of capacitor 56 is electrically coupled to VCO core 22 via output conductor 28. The other terminal of capacitor 54 is electrically coupled to the gate of transistor 58 and one terminal of resistor 62 via conductive path 68. The other terminal of capacitor 56 is electrically coupled to the gate of transistor 60 and one terminal of resistor 64 via conductive path 70. The other terminals of resistors 62 and 64 are electrically coupled to the gate and one side of the drain-source path of transistor 66 via conductive path 72. The other side of the drain-source path of transistor 66 is electrically coupled to a reference, such as ground, at 74.

The drain-source paths of transistors 58 and 60 are electrically coupled on one side via amplifier input path 80 and on the other side via conductive path 76. Conductive path 76 is electrically coupled to a reference, such as ground, at 78.

Alternating current (AC) components of output signals OUTPUT1 and OUTPUT2 pass through capacitors 54 and 56 to the gates of transistors 58 and 60. Capacitor 54 blocks DC components of output signal OUTPUT1 on output conductor 26, and capacitor 56 blocks DC components of output signal OUTPUT2 on output conductor 28. The gate of transistor 58 receives AC components of output signal OUTPUT1 via conductive path 68, and the gate of transistor 60 receives AC components of output signal OUTPUT2 via conductive path 70.

Transistor 66 is a diode-connected transistor that provides a DC voltage VDC on conductive path 72. Transistor 66 is biased near threshold to provide about the threshold voltage as the DC voltage VDC on conductive path 72. The voltage provided on conductive paths 68 and 70 through resistors 62 and 64 is about the same as the DC voltage VDC. The AC components of output signal OUTPUT1 on conductive path 68 oscillate around the voltage provided through resistor 62, and the AC components of output signal OUTPUT2 on conductive path 70 oscillate around the voltage provided through resistor 64.

The AC components of the output signals OUTPUT1 and OUTPUT2 are out of phase with one another. As the signal on conductive path 68 transitions high relative to the signal on conductive path 70, transistor 60 is biased to conduct less current and transistor 58 is biased to conduct more current provided via amplifier input path 80. The current flows through transistor 58 to conductive path 76 and the reference at 78. As the signal on conductive path 68 transitions low relative to the signal on conductive path 70, transistor 58 is biased to conduct less current and transistor 60 is biased to conduct more current provided via amplifier input path 80. The current flows through transistor 60 to conductive path 76 and the reference at 78. In one embodiment, where the AC components of output signals OUTPUT1 and OUTPUT2 are essentially symmetrical and 180 degrees out of phase with one another, transistor 58 is biased to conduct more current about half the time and transistor 60 is biased to conduct more current the other half of the time.

ACC 24 includes a resistor 82, a capacitor 84, and an amplifier 86 electrically coupled to transistors 58 and 60 via amplifier input path 80. Transistors 58 and 60 are electrically coupled to one terminal of resistor 82 and one terminal of capacitor 84 via amplifier input path 80. The other terminal of resistor 82 and the other terminal of capacitor 84 are electrically coupled to power supply voltage VDD via power conductive path 32. Transistors 58 and 60 are electrically coupled to the negative input of amplifier 86 via amplifier input path 80.

As transistors 58 and 60 are biased to conduct, current is supplied from capacitor 84 and through resistor 82 to transistors 58 and 60 via amplifier input path 80. The supplied current is related to the strength and duration of the biases on each of the transistors 58 and 60 and the biases are related to the amplitudes of output signals OUTPUT1 and OUTPUT2. The resulting signal from the differential pair of transistors 58 and 60 is filtered and integrated by capacitor 84 to provide a near-DC voltage VSQ on amplifier input path 80 at the negative input of amplifier 86. The near-DC voltage VSQ is related to the amplitudes of output signals OUTPUT1 and OUTPUT2.

ACC 24 includes a capacitor 88, resistors 90 and 92, NMOS transistor 94 and a current source 96. The positive input of amplifier 86 is electrically coupled to one terminal of capacitor 88 and to one terminal of resistor 90 via amplifier input path 98. The other terminal of capacitor 88 and the other terminal of resistor 90 are electrically coupled to power supply voltage VDD via power conductive path 32. The positive input of amplifier 86 is also electrically coupled to one side of the drain-source path of transistor 94 via amplifier input path 98. The other side of the drain-source path of transistor 94 is electrically coupled to a reference, such as ground, at 100. In one embodiment, all references at 74, 78, and 100 are the same. In one embodiment, all references 74, 78, and 100 are at ground.

The gate of transistor 94 is electrically coupled to one side of current source 96 and to one terminal of resistor 92 via conductive path 102. The other side of current source 96 is electrically coupled to power supply voltage VDD via power conductive path 32, and the other terminal of resistor 92 is electrically coupled to the gate and drain-source path of transistor 66 via conductive path 72.

Current source 96 provides current through resistor 92 and transistor 66 to the reference at 74. The current through resistor 92 and transistor 66 creates a voltage VRG on conductive path 102. Transistor 66 is the diode-connected transistor that provides DC voltage VDC on conductive path 72. The voltage VRG is equal to the DC voltage VDC plus the voltage across resistor 92, and is proportional to the resistance value of resistor 92.

In one embodiment, resistor 92 is a poly-silicon resistor and current from current source 96 is derived from a band-gap reference voltage divided by a current sink poly-silicon resistor. The resistance value of resistor 92 and the resistance value of the current sink poly-silicon resistor change together to ensure a constant voltage across resistor 92 over process, voltage and temperature changes. In one embodiment, resistor 92 is a variable resistor, such as a programmable resistor, and the resistance value of resistor 92 is varied to change the voltage VRG. In one embodiment, resistor 92 has a constant resistance value and current through current source 96 is varied to change the voltage VRG.

The voltage VRG biases transistor 94 to conduct more or less current through transistor 94 to the reference at 100. The current that flows through transistor 94 is supplied through resistor 90 to transistor 94 via amplifier input path 98. The current that flows through resistor 90 causes a voltage drop across resistor 90. The resulting voltage VREF on amplifier input path 98 is filtered by capacitor 88 and used as a reference voltage at the positive input of amplifier 86. The output of amplifier 86 is electrically coupled to the gate of transistor 46 via tail current bias conductor 30.

Amplifier circuitry, indicated at 89, includes amplifier 86 and capacitors 84 and 88. Amplifier circuitry 89 receives the voltage signal VSQ on amplifier input path 80 and the reference voltage VREF on amplifier input path 98 and provides tail current bias voltage VTC to the gate of transistor 46. In other embodiments described herein, amplifier circuitry 89 includes other suitable components.

Amplifier 86 compares the voltage signal VSQ to the reference voltage VREF. If the voltage signal VSQ is greater than the reference voltage VREF, amplifier 86 provides a low output voltage as the tail current bias voltage VTC on tail current bias conductor 30. A larger difference between the voltage signal VSQ and the reference voltage VREF produces a lower tail current bias voltage VTC. The lower tail current bias voltage VTC biases transistor 46 to conduct more current to provide more current to VCO core 22. The increased current provided to VCO core 22 increases the amplitude of the output signals OUTPUT1 and OUTPUT2, which lowers the voltage signal VSQ toward the reference voltage VREF.

If the voltage signal VSQ is less than the reference voltage VREF, amplifier 86 provides a high output voltage as the tail current bias voltage VTC on tail current bias conductor 30. A larger difference between the voltage signal VSQ and the reference voltage VREF produces a higher tail current bias voltage VTC. A higher tail current bias voltage VTC biases transistor 46 to conduct less current and provide a reduced current to VCO core 22. The reduced current provided to VCO core 22 decreases the amplitude of the output signals OUTPUT1 and OUTPUT2, which raises the voltage signal VSQ toward the reference voltage VREF. In steady state, the voltage signal VSQ is essentially equal to the reference voltage VREF.

The amplitudes, such as the peak-to-peak amplitudes, of the output signals OUTPUT1 and OUTPUT2 are set by adjusting the reference voltage VREF. If the reference voltage VREF is lowered, the amplitudes of the output signals OUTPUT1 and OUTPUT2 are increased to lower the voltage signal VSQ. If the reference voltage VREF is raised, the amplitudes of the output signals OUTPUT1 and OUTPUT2 are reduced to raise the voltage signal VSQ.

In one embodiment, the reference voltage VREF is set by adjusting the resistance value of resistor 92. If the resistance value of resistor 92 is raised, the voltage VRG increases to bias transistor 94 to conduct more current and lower the reference voltage VREF, which increases the amplitudes of the output signals OUTPUT1 and OUTPUT2. If the resistance value of resistor 92 is lowered, the voltage VRG decreases to bias transistor 94 to conduct less current and raise the reference voltage VREF, which decreases the amplitudes of the output signals OUTPUT1 and OUTPUT2. Raising the resistance value of resistor 92 increases the amplitude of output signals OUTPUT1 and OUTPUT2, and lowering the resistance value of resistor 92 decreases the amplitude of output signals OUTPUT1 and OUTPUT2.

In operation of one embodiment of VCO 20, VCO core 22 provides differential output signals OUTPUT1 and OUTPUT2 on output conductors 26 and 28. Each of the output signals OUTPUT1 and OUTPUT2 includes an AC component that is sinusoidal and has amplitude of A. The AC component of each of the output signals OUTPUT1 and OUTPUT2 is represented by the following Equation I.

$$\text{OUTPUT}_{AC} = A \times \cos(\omega t) \quad \text{Equation I}$$

The signals on conductive paths 68 and 70 include the out-of-phase AC components of output signals OUTPUT1 and OUTPUT2 and the DC threshold voltage $V_T$ from conductive path 72. The signals on conductive paths 68 and 70 are represented by the following Equation II.

$$\text{Input}_{68,70} = V_T \pm A \times \cos(\omega t) \quad \text{Equation II}$$

Current flows through resistor 82 as transistors 58 and 60 are biased to conduct more or less current. The current that flows through transistors 58 and 60 is represented by the following Equation III.

$$I = \frac{1}{2}\mu \times C_{OX} \times W/L \times (V_T + A \times \cos(\omega t) - V_T)^2 \cong \frac{1}{2}\mu \times C_{OX} \times W/L \times [A \times \cos(\omega t)]^2$$

$$I = \frac{1}{2}\mu \times C_{OX} \times W/L \times A^2 \times [1 + \cos(2\omega t)]/2 \quad \text{Equation III}$$

Where, μ is the device mobility, $C_{OX}$ is the oxide capacitance of transistors 58 and 60, and W/L is the aspect ratio of transistors 58 and 60.

The DC component of current I is taken from the above Equation III and represented by the following Equation IV.

$$I_{DC} = \tfrac{1}{4}\mu \times C_{OX} \times W/L \times A^2 \qquad \text{Equation IV}$$

The current flowing through resistor 82 (R82) and capacitor 84 provides a near-DC voltage VSQ on amplifier input path 80 represented by the following Equation V.

$$VSQ = VDD - R82 \times \lfloor \tfrac{1}{4}\mu \times C_{OX} \times W/L \times A^2 \rfloor \qquad \text{Equation V}$$

The near-DC voltage VSQ on amplifier input path 80 is compared to the reference voltage VREF on amplifier input path 98 to obtain the tail current bias voltage VTC. The tail current bias voltage VTC adjusts the current flowing through transistor 46 and the amplitudes of output signals OUTPUT1 and OUTPUT2.

To set the amplitudes of output signals OUTPUT1 and OUTPUT2 to a selected value, the resistance value of resistor 92 is set to adjust the reference voltage VREF. In one embodiment, transistors 58, 60, and 94 are essentially identical transistors and resistors 82 and 90 have essentially the same resistance values, such that the selected amplitudes of output signals OUTPUT1 and OUTPUT2 are achieved by setting the voltage across resistor 92 equal to the selected amplitude A divided by the square root of 2, as derived in the following Equations VI through IX.

The reference voltage VREF is equal to the power supply voltage VDD minus the voltage across resistor 90 (R90), which is represented by the following Equations VI–VIII.

$$VREF = VDD - R90 \times \lfloor \tfrac{1}{2}\mu \times C_{OX} \times W/L \times (VRG - V_T)^2 \rfloor \qquad \text{Equation VI}$$

where, $$VRG = VDC + VR92 \cong V_T + VR92 \qquad \text{Equation VII}$$

which can be rewritten as follows:

$$VREF = VDD - R90 \times [\tfrac{1}{2}\mu \times C_{OX} \times W/L \times (V_T + VR92 - V_T)^2]$$

$$VREF = VDD - R90 \times [\tfrac{1}{2}\mu \times C_{OX} \times W/L \times VR92^2] \qquad \text{Equation VIII}$$

In the above Equations VI–VIII, μ is the device mobility, $C_{OX}$ is the oxide capacitance of transistor 94, and W/L is the aspect ratio of transistor 94. Also, VRG is the voltage on conductive path 102, VDC is the voltage on conductive path 72, and VR92 is the voltage across resistor 92.

In steady state, the voltage VSQ is essentially equal to the reference voltage VREF. By equating Equation V, which is the voltage VSQ, to Equation VIII, which is the reference voltage VREF, the relationship between the amplitude A of output signals OUTPUT1 and OUTPUT2 and the voltage across resistor 92 is derived and represented by the following Equation IX.

$$VDD - R82 \times \lfloor \tfrac{1}{4}\mu \times C_{OX} \times W/L \times A^2 \rfloor = VDD - R90 \times \lfloor \tfrac{1}{2}\mu \times C_{OX} \times W/L \times VR92^2 \rfloor \qquad \text{Equation IX}$$

therefore, $$\tfrac{1}{2} \times A^2 = VR92^2 \text{ or } A = \sqrt{2} \times VR92$$

Thus, the amplitude A of each of the output signals OUTPUT1 and OUTPUT2 is equal to the voltage across resistor 92, VR92, times the square root of 2. In other words, the voltage across resistor 92, VR92, is equal to the amplitude A divided by the square root of 2.

In one embodiment, where transistors 58, 60, and 94 are essentially identical and Equation VIII holds true, current source 96 provides a current of 20 micro-amperes through resistor 92 and the threshold voltage VT equals 0.3 volts. To obtain amplitude A of 200 millivolts, VR92 is set equal to 200 millivolts divided by the square root of 2 or 141 millivolts. Applying ohms law yields a resistance value of 7 KOhms for resistor 92 and a voltage VRG of 0.41 volts. Also, to obtain amplitude A of 400 millivolts, VR92 is set equal to 400 millivolts divided by the square root of 2 or 282 millivolts. Applying ohms law yields a resistance value of 14 KOhms for resistor 92 and a voltage VRG of 0.58 volts. Dividing the amplitude A by the square root of 2 provides a smaller voltage VRG on conductive path 102. The smaller voltage VRG enables low voltage CMOS operation.

Figure 2:
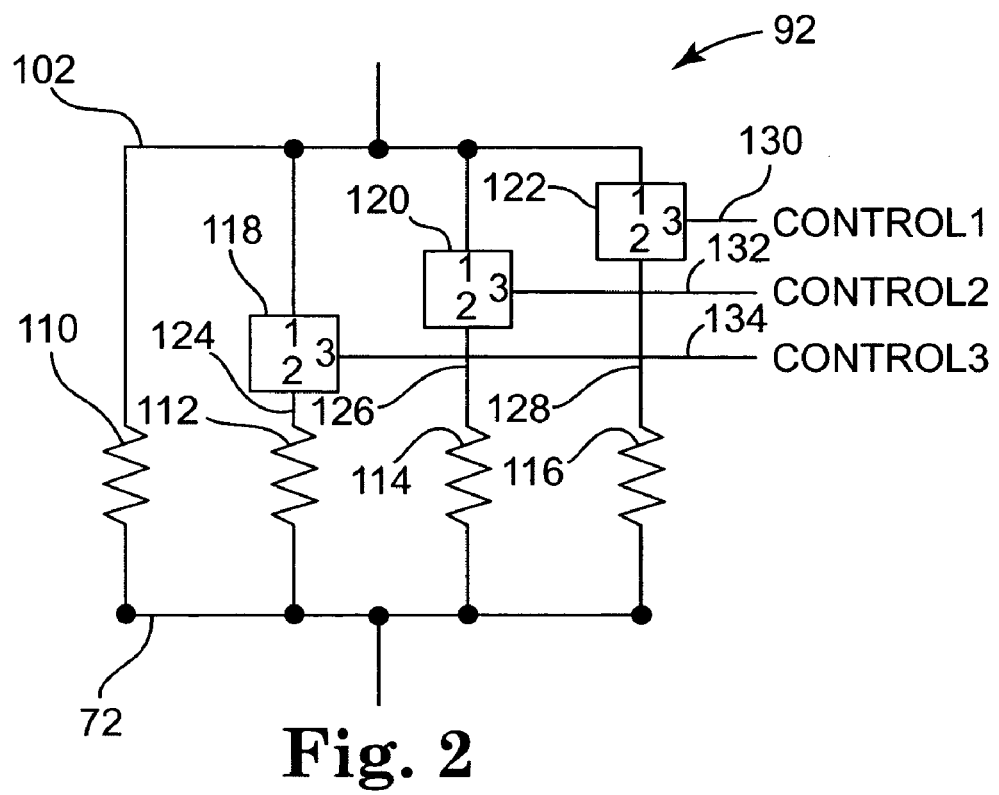
FIG. 2 is a diagram illustrating one embodiment of a resistor.

FIG. 2 is a diagram illustrating one embodiment of resistor 92. Resistor 92 includes resistive elements 110, 112, 114, and 116 and switches 118, 120, and 122. Resistor 92 is a programmable resistor network including parallel coupled resistive elements 110, 112, 114, and 116. The resistive elements 112, 114, and 116 are switched in or out of the resistor network to change the resistance value of resistor 92. In other embodiments, resistor 92 includes any suitable number of resistive elements and switches. Also, in other embodiments, resistor 92 is any suitable type of programmable resistor network, such as a resistor network having series coupled resistive elements.

Each of the terminals 1 of switches 118, 120, and 122 are electrically coupled to one terminal of resistive element 110 via conductive path 102. Terminal 2 of switch 118 is electrically coupled to one terminal of resistive element 112 via conductive path 124. Terminal 2 of switch 120 is electrically coupled to one terminal of resistive element 114 via conductive path 126, and terminal 2 of switch 122 is electrically coupled to one terminal of resistive element 116 via conductive path 128. The other terminals of each of the resistive elements 110, 112, 114, and 116 are electrically coupled together via conductive path 72.

Switches 118, 120, and 122 are electrically coupled to a control circuit (not shown), such as a microprocessor, via control signal paths 134, 132, and 130. Terminal 3 of switch 122 is electrically coupled to control signal path 130 to receive control signal CONTROL1. Terminal 3 of switch 120 is electrically coupled to control signal path 132 to receive control signal CONTROL2, and terminal 3 of switch 118 is electrically coupled to control signal path 134 to receive control signal CONTROL3. The control circuit provides control signals CONTROL1, CONTROL2, and CONTROL3 to switches 122, 120, and 118 to switch in or out resistive elements 116, 114, and 112. In one embodiment, the control circuit includes a register that is set to maintain the control signals CONTROL1, CONTROL2, and CONTROL3 at selected voltage levels.

Switches 122, 120, and 118 are controlled to conduct or act as open circuits between terminals 1 and 2 in response to control signals CONTROL1, CONTROL2, and CONTROL3. In one embodiment, switch 118 conducts in response to receiving a high control signal CONTROL3 and acts as an open circuit in response to receiving a low control signal CONTROL3, switch 120 conducts in response to receiving a high control signal CONTROL2 and acts as an open circuit in response to receiving a low control signal CONTROL2, and switch 122 conducts in response to receiving a high control signal CONTROL1 and acts as an open circuit in response to receiving a low control signal CONTROL1. In other embodiments, switches 118, 120, and 122 conduct and act as open circuits in response to receiving any suitable control signal values.

Resistor 92 has a maximum resistance value equal to the resistance value of resistive element 110. Resistive elements 112, 114 and 116 are switched in or out of the resistor network to change the resistance value of resistor 92. As resistive elements are switched into the resistor network, the resistance value of resistor 92 is reduced. Setting the resistance value of resistor 92 sets the reference voltage VREF and the amplitudes of output signals OUTPUT1 and OUTPUT2.

Figure 3:
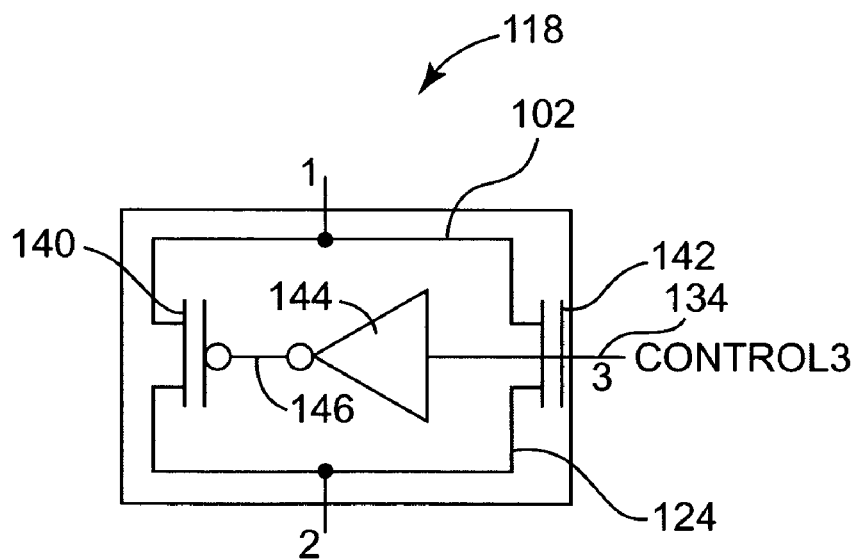
FIG. 3 is a diagram illustrating one embodiment of a switch.

FIG. 3 is a diagram illustrating one embodiment of a switch 118. Switch 118 includes PMOS transistor 140, NMOS transistor 142, and inverter 144. The PMOS transistor 140 and NMOS transistor 142 are coupled in parallel between terminals 1 and 2 of switch 118. The drain-source path of PMOS transistor 140 and the drain-source path of NMOS transistor 142 are electrically coupled on one side via conductive path 102. The drain-source path of PMOS transistor 140 and the drain-source path of NMOS transistor 142 are electrically coupled on the other side via conductive path 124. The gate of NMOS transistor 142 is electrically coupled to the input of inverter 144 via conductive path 134 at terminal 3 of switch 118. Control signal CONTROL3 is received on conductive path 134 at terminal 3. The output of inverter 144 is electrically coupled to the gate of PMOS transistor 140 via conductive path 146. In one embodiment, each of the switches 120 and 122 is similar to switch 118.

In operation, a high control signal CONTROL3, turns on NMOS transistor 142. The drain-source path of NMOS transistor 142 conducts between terminals 1 and 2. Inverter 144 receives the high control signal CONTROL3 and provides a low output signal to the gate of PMOS transistor 140. PMOS transistor 140 is turned on and the drain-source path of PMOS transistor 140 also conducts between terminals 1 and 2. With NMOS transistor 142 and PMOS transistor 140 conducting, switch 118 provides a low impedance between terminals 1 and 2 to switch resistor 112 into the resistor network.

A low control signal CONTROL3, turns off NMOS transistor 142 and the drain-source path of NMOS transistor 142 acts as an open circuit between terminals 1 and 2. Inverter 144 receives the low control signal CONTROL3 and provides a high output signal to the gate of PMOS transistor 140. PMOS transistor 140 is turned off and the drain-source path of PMOS transistor 140 acts as an open circuit between terminals 1 and 2. With NMOS transistor 142 and PMOS transistor 140 turned off, switch 118 provides a high impedance or open circuit between terminals 1 and 2 to switch resistor 112 out of the resistor network.

Figure 4:
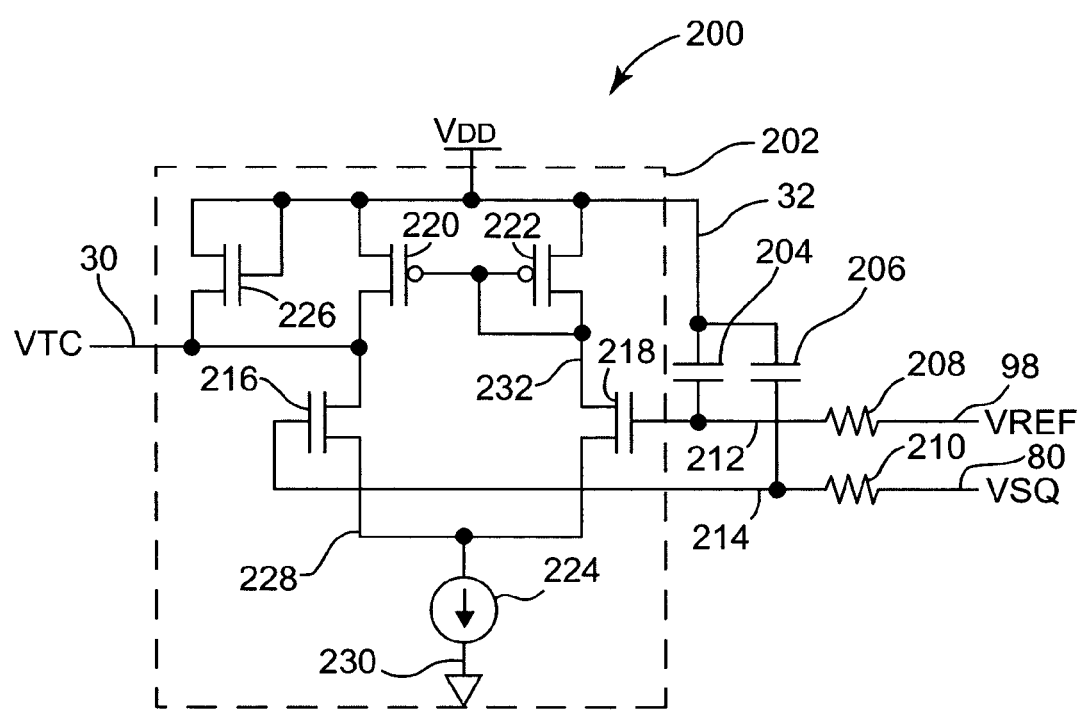
FIG. 4 is a diagram illustrating one embodiment of amplifier circuitry.

FIG. 4 is a diagram illustrating one embodiment of amplifier circuitry 200. Amplifier circuitry 200 includes a differential amplifier 202, capacitors 204 and 206, and resistors 208 and 210. In one embodiment, amplifier circuitry 200 is used in place of amplifier circuitry 89 (shown in FIG. 1). The output of differential amplifier 202 is electrically coupled to the gate of transistor 46 via tail current bias conductor 30. One terminal of resistor 208 is electrically coupled to amplifier input path 98 and one terminal of resistor 210 is electrically coupled to amplifier input path 80. Amplifier circuitry 200 receives the voltage signal VSQ on amplifier input path 80 and the reference voltage VREF on amplifier input path 98. In response, amplifier circuitry 200 provides tail current bias voltage VTC to the gate of transistor 46 via tail current bias conductor 30.

One input of differential amplifier 202 is electrically coupled to the other terminal of resistor 208 and one terminal of capacitor 204 via conductive path 212, and the other input of differential amplifier 202 is electrically coupled to the other terminal of resistor 210 and one terminal of capacitor 206 via conductive path 214. The differential amplifier 202 and the other terminals of capacitors 204 and 206 are electrically coupled to power supply voltage VDD via power conductive path 32.

Differential amplifier 202 includes a differential pair of transistors 216 and 218, current mirror transistors 220 and 222, a current source 224, and a clamping circuit, indicated at 226. In one embodiment, transistors 216 and 218 are NMOS transistors, transistors 220 and 222 are PMOS transistors, and clamping circuit 226 is a diode-connected NMOS transistor. In other embodiments, clamping circuit 226 includes any suitable number of transistors and any suitable type of transistors.

The gate of transistor 218 is electrically coupled to resistor 208 and one terminal of capacitor 204 via conductive path 212, and the gate of transistor 216 is electrically coupled to resistor 210 and one terminal of capacitor 206 via conductive path 214. One side of the drain-source path of transistor 218 is electrically coupled to one side of the drain-source path of transistor 216 and to one terminal of current source 224 via conductive path 228. The other terminal of current source 224 is electrically coupled to a reference, such as ground, at 230.

The other side of the drain-source path of transistor 218 is electrically coupled to the gate and one side of the drain-source path of transistor 222 and the gate of transistor 220 via conductive path 232. The other side of the drain-source path of transistor 216 is electrically coupled to one side of the drain-source path of transistor 220 and one side of the drain-source path of clamping circuit 226 via tail current bias conductor 30. The other side of the drain-source paths of transistors 220 and 222 and the gate and the other side of the drain-source path of clamping circuit 226 are electrically coupled to power conductive path 32 to receive power supply voltage VDD.

Resistor 208 receives the reference voltage VREF and provides a corresponding signal to capacitor 204 and the gate of transistor 218. Capacitor 204 filters the signal on conductive path 212. Resistor 210 receives the voltage signal VSQ and provides a corresponding signal to capacitor 206 and the gate of transistor 216. Capacitor 206 filters and integrates the signal on conductive path 214.

In one embodiment, to stabilize amplifier circuitry 200 and the ACC, a dominant pole is formed at conductive path 214. Resistor 82 (shown in FIG. 1) provides a low impedance path to power supply voltage VDD and resistor 210 provides a large resistance value coupled to capacitor 206. Also, with the signal on conductive path 212 biased near the mid-point of the difference between VDD and a reference, such as ground, capacitors 204 and 206 can be any suitable type of capacitor, such as a PMOS capacitor coupled to VDD or an NMOS capacitor coupled to the reference.

The differential pair of transistors 216 and 218 distinguishes between the received signals. One of the transistors 216 and 218 is biased to conduct more current and the other is biased to conduct less current. The current mirror transistors 220 and 222 act as an active load and provide a high effective load resistance, which increases gain through differential amplifier 202.

Clamping circuit 226 sets the lower limit of the tail current bias voltage VTC, which sets an upper limit to the amplitudes of the output signals OUTPUT1 and OUTPUT2. ACC 24 (shown in FIG. 1) provides a low tail current bias voltage VTC at start up to ensure that VCO core 22 (shown in FIG. 1) begins oscillating. At start up, VCO core 22 is not oscillating and the voltage signal VSQ is near VDD, which is greater than the reference voltage VREF. The tail current bias voltage VTC is low and limited by the clamping circuit 226. The lower limit of the tail current bias voltage VTC is bounded to VDD minus the drop across clamping circuit 226. Limiting the amplitudes of the output signals OUTPUT1 and OUTPUT2 avoids over-voltage conditions above VDD or below the reference. These over-voltage conditions can otherwise lead to substrate current and device stress. Clamping circuit 226 is an NMOS diode-connected transistor.

In other embodiments, clamping circuit 226 can be any suitable clamping circuit. In operation, resistor 208 receives the reference voltage VREF and provides a signal to the gate of transistor 218. Also, resistor 210 receives the voltage signal VSQ and provides a signal to the gate of transistor 216. The differential pair of transistors 216 and 218 distinguishes between the received signals, such that one of the transistors 216 and 218 is biased to conduct more current and the other is biased to conduct less current. If transistor 218 is biased to conduct more current, the current through transistor 218 is greater than the current through transistor 216. The current mirror transistors 220 and 222 are biased to conduct more current and the tail current bias voltage VTC is charged to a high voltage level. If transistor 216 is biased to conduct more current, the current through transistor 216 is greater than the current through transistor 218. The current mirror transistors 220 and 222 are biased to conduct less current and the tail current bias voltage VTC is discharged to a low voltage. Clamping circuit 226 clamps the lower limit of the tail current bias voltage VTC and sets an upper limit to the amplitudes of the output signals OUTPUT1 and OUTPUT2.

Figure 5:
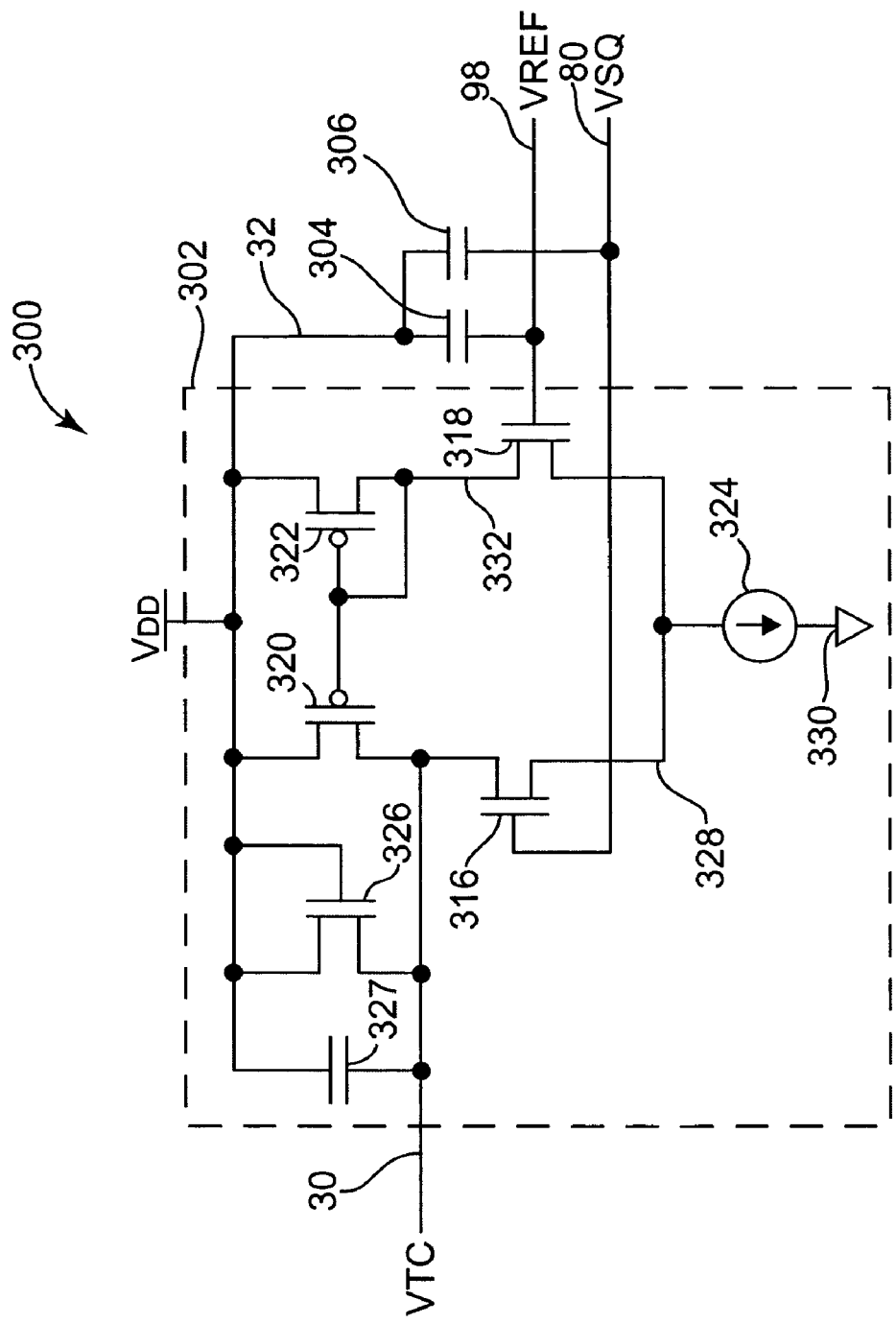
FIG. 5 is a diagram illustrating another embodiment of amplifier circuitry.

FIG. 5 is a diagram illustrating one embodiment of amplifier circuitry 300. Amplifier circuitry 300 includes a differential amplifier 302 and capacitors 304 and 306. In one embodiment, amplifier circuitry 300 is used in place of amplifier circuitry 89 (shown in FIG. 1).

One input of differential amplifier 302 is electrically coupled to one terminal of capacitor 304 via amplifier input path 98, and the other input of differential amplifier 302 is electrically coupled to one terminal of capacitor 306 via amplifier input path 80. The output of differential amplifier 302 is electrically coupled to the gate of transistor 46 via tail current bias conductor 30. The differential amplifier 302 and the other terminals of capacitors 304 and 306 are electrically coupled to power supply voltage VDD via power conductive path 32.

Amplifier circuitry 300 receives the voltage signal VSQ on amplifier input path 80 and the reference voltage VREF on amplifier input path 98. In response, amplifier circuitry 300 provides tail current bias voltage VTC to the gate of transistor 46 via tail current bias conductor 30.

Differential amplifier 302 includes a differential pair of transistors 316 and 318, current mirror transistors 320 and 322, a current source 324, a clamping circuit 326, and a capacitor 327. In one embodiment, transistors 316 and 318 are NMOS transistors, transistors 320 and 322 are PMOS transistors, and clamping circuit 326 is a diode-connected NMOS transistor. In other embodiments, clamping circuit 326 includes any suitable number of transistors and any suitable type of transistors.

The gate of transistor 318 is electrically coupled to capacitor 304 via amplifier input path 98, and the gate of transistor 316 is electrically coupled to capacitor 306 via amplifier input path 80. One side of the drain-source path of transistor 318 is electrically coupled to one side of the drain-source path of transistor 316 and to one terminal of current source 324 via conductive path 328. The other terminal of current source 324 is electrically coupled to a reference, such as ground, at 330.

The other side of the drain-source path of transistor 318 is electrically coupled to the gate and one side of the drain-source path of transistor 322 and the gate of transistor 320 via conductive path 332. The other side of the drain-source path of transistor 316 is electrically coupled to one side of the drain-source path of transistor 320, one side of the drain-source path of clamping circuit 326, and to one terminal of capacitor 327 via tail current bias conductor 30. The other side of the drain-source paths of transistors 320 and 322, the other terminal of capacitor 327, and the gate and the other side of the drain-source path of clamping circuit 326 are electrically coupled to receive power supply voltage VDD via power conductive path 32.

The gate of transistor 318 receives the reference voltage VREF and the gate of transistor 316 receives the voltage signal VSQ. The differential pair of transistors 316 and 318 distinguishes between the received signals. One of the transistors 316 and 318 is biased to conduct more current and the other is biased to conduct less current. The current mirror transistors 320 and 322 act as an active load and provide a high effective load resistance, which increases gain through differential amplifier 302.

Clamping circuit 326 sets the lower limit of the tail current bias voltage VTC, which sets an upper limit to the amplitudes of the output signals OUTPUT1 and OUTPUT2. ACC 24 (shown in FIG. 1) provides a low tail current bias voltage VTC at start up to ensure that VCO core 22 (shown in FIG. 1) begins oscillating. At start up, VCO core 22 is not oscillating and the voltage signal VSQ is near VDD, which is greater than the reference voltage VREF. The tail current bias voltage VTC is low and limited by clamping circuit 326. The lower limit of the tail current bias voltage VTC is bounded to VDD minus the drop across clamping circuit 326. Limiting the amplitudes of the output signals OUTPUT1 and OUTPUT2 avoids over-voltage conditions above VDD or below the reference. These over-voltage conditions can otherwise lead to substrate current and device stress. Clamping circuit 326 is an NMOS diode-connected transistor. In other embodiments, clamping circuit 326 can be any suitable clamping circuit.

To stabilize amplifier circuitry 300 and the ACC, a dominant pole is formed at tail current bias conductor 30. The output of differential amplifier 302 provides a high impedance output coupled to capacitor 327. In one embodiment, capacitor 327 is a stacked metal capacitor. In one embodiment, capacitor 327 is a VDD coupled PMOS capacitor. In other embodiments, capacitor 327 is any suitable capacitor, such as a voltage independent capacitor.

In operation, the gate of transistor 318 receives the reference voltage VREF and the gate of transistor 316 receives the voltage signal VSQ. The differential pair of transistors 316 and 318 distinguishes between the received signals, such that one of the transistors 316 and 318 is biased to conduct more current and the other is biased to conduct less current. If transistor 318 is biased to conduct more current, the current through transistor 318 is greater than the current through transistor 316. The current mirror transistors 320 and 322 are biased to conduct more current and the tail current bias voltage VTC is charged to a high voltage level. If transistor 316 is biased to conduct more current, the current through transistor 316 is greater than the current through transistor 318. The current mirror transistors 320 and 322 are biased to conduct less current and the tail current bias voltage VTC is discharged to a low voltage. Clamping circuit 326 clamps the lower limit of the tail current bias voltage VTC and sets an upper limit to the amplitudes of the output signals OUTPUT1 and OUTPUT2.

Figure 6:
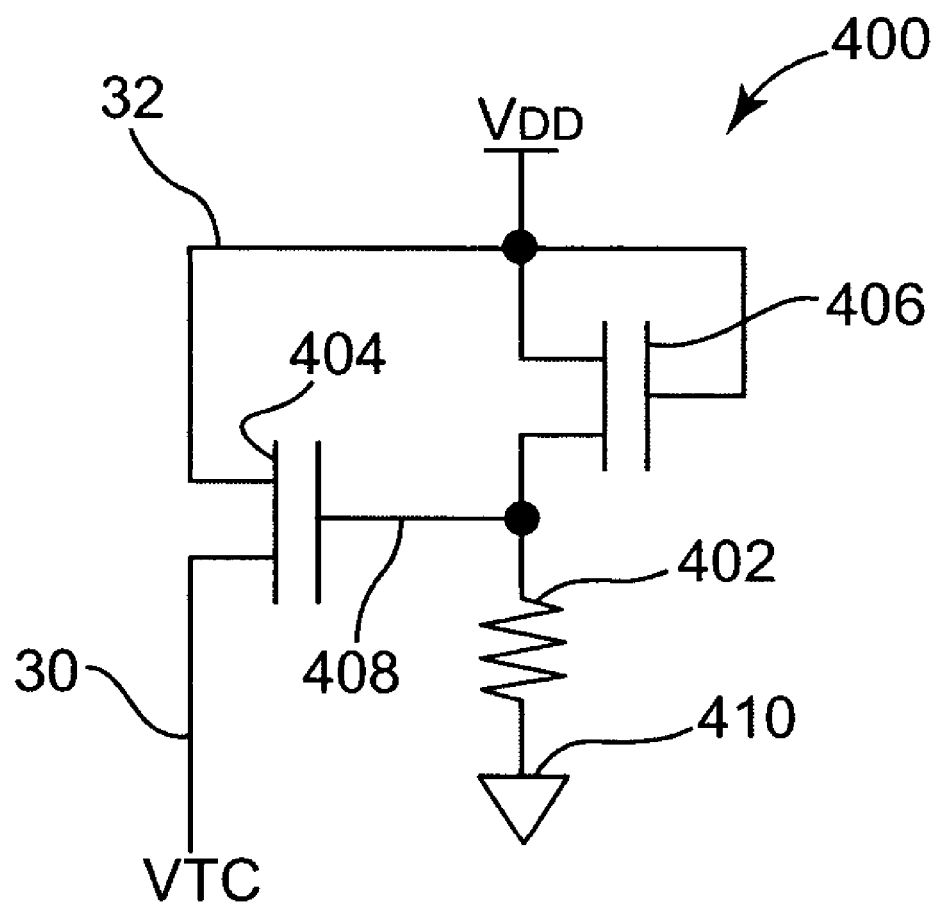
FIG. 6 is a diagram illustrating one embodiment of a clamping circuit.

FIG. 6 is a diagram illustrating one embodiment of a clamping circuit 400. The clamping circuit 400 includes resistor 402 and NMOS transistors 404 and 406 in a cascaded diode-connected clamp structure. In other embodiments, the clamping circuit can have any suitable number of components in any suitable clamping structure.

In one embodiment, clamping circuit 400 is used in place of clamping circuit 226 in amplifier circuitry 200 of FIG. 4. In one embodiment, clamping circuit 400 is used in place of clamping circuit 326 in amplifier circuitry 300 of FIG. 5.

One side of the drain-source path of transistor 404 is electrically coupled to tail current bias conductor 30. The other side of the drain-source path of transistor 404 is electrically coupled to the gate and one side of the drain-source path of transistor 406 and to power supply voltage VDD via power conductive path 32. The other side of the drain-source path of transistor 406 is electrically coupled to the gate of transistor 404 and one terminal of resistor 402 via conductive path 408. The other terminal of resistor 402 is electrically coupled to a reference, such as ground, at 410.

Transistor 406 is a diode-connected transistor that provides a gate bias voltage to the gate of transistor 404 via conductive path 408. Resistor 402 provides a high resistance value. As the tail current bias voltage VTC decreases, transistor 404 clamps the tail current bias voltage VTC to VDD minus the sum of the threshold voltage of transistor 404 and the threshold voltage of transistor 406. The cascaded diode-connected clamp structure helps eliminate interference at or near steady state.

Figure 7:
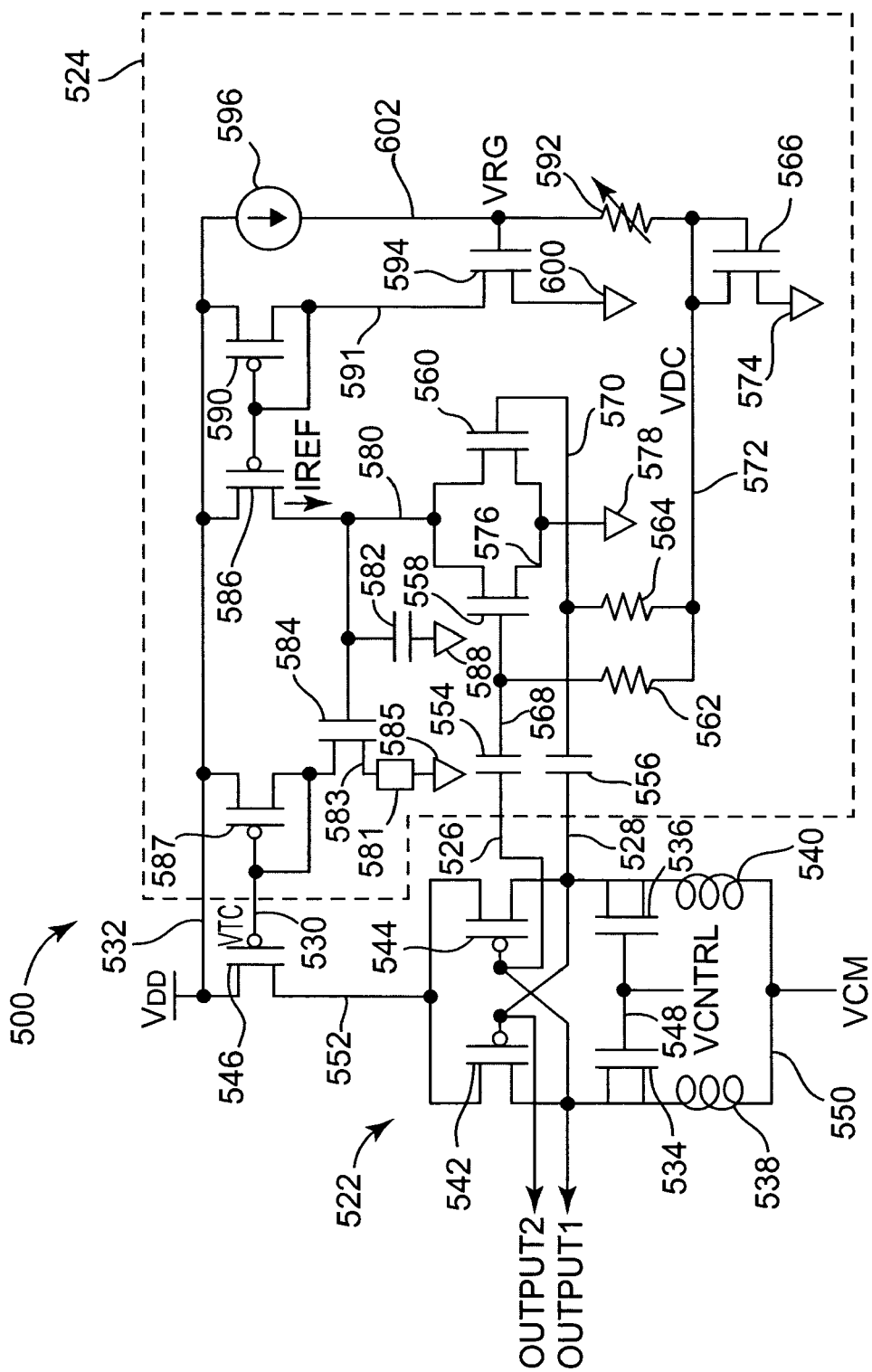
FIG. 7 is a diagram illustrating another embodiment of an amplitude control circuit in another embodiment of a voltage controlled oscillator.

FIG. 7 is a diagram illustrating one embodiment of an ACC 524 in one embodiment of a VCO 500. VCO 500 includes a VCO core 522 and ACC 524. VCO core 522 is electrically coupled to ACC 524 via output conductors 526 and 528 and tail current bias conductor 530. Also, VCO core 522 and ACC 524 are electrically coupled to power supply voltage VDD via power conductive path 532.

ACC 524 receives differential output signals from VCO core 522 via output conductors 526 and 528. The differential output signals oscillate out of phase with each other. Each of the differential output signals biases one transistor in a differential pair of transistors. The differential pair of transistors conducts current that is related to the amplitudes of the differential output signals. The current conducted by the differential pair of transistors is compared to a programmable reference current to control the tail current of VCO core 522 and the amplitudes of the differential output signals. In other embodiments, ACC 524 can be used in any suitable circuit to control the amplitude of signals received from the circuit.

VCO core 522 includes NMOS varactors 534 and 536, inductors 538 and 540, and PMOS transistors 542, 544, and 546. The gate of varactor 534 is electrically coupled to the gate of varactor 536 via control signal path 548. The drain and source of varactor 534 are electrically coupled together and to one terminal of inductor 538 via output conductor 526. Also, the drain and source of varactor 536 are electrically coupled together and to one terminal of inductor 540 via output conductor 528. The other terminal of inductor 538 is electrically coupled to the other terminal of inductor 540 via common mode signal path 550.

Varactors 534 and 536 and inductors 538 and 540 oscillate at a resonant frequency based on the capacitance values of varactors 534 and 536 and the inductance values of inductors 538 and 540. The capacitance values of varactors 534 and 536 are controlled by a control voltage VCNTRL on control signal path 548. The control voltage VCNTRL controls the oscillating frequency of VCO core 522 via varactors 534 and 536. A common mode voltage VCM is provided for bias on common mode signal path 550. Transistors 542, 544, and 546 provide a negative resistance to cancel energy losses presented by oscillating varactors 534 and 536 and inductors 538 and 540 and to set the amplitudes of output signals OUTPUT1 and OUTPUT2 on output conductors 526 and 528.

The drain and source terminal of varactor 534 is electrically coupled to the drain-source path of transistor 542 and to the gate of transistor 544 via output conductor 526. The drain and source terminal of varactor 536 is electrically coupled to the drain-source path of transistor 544 and to the gate of transistor 542 via output conductor 528. Also, the drain-source paths of transistors 542 and 544 are electrically coupled to the drain-source path of transistor 546 via tail current conductive path 552. The other side of the drain-source path of transistor 546 is electrically coupled to power supply voltage VDD via power conductive path 532. The gate of transistor 546 is electrically coupled to ACC 524 via tail current bias conductor 530.

VCO core 522 oscillates to provide oscillating differential output signals OUTPUT1 and OUTPUT2 on output conductors 526 and 528, respectively. A portion of ACC 524 is coupled to transistor 546 to form a current mirror structure that provides a tail current bias voltage VTC on tail current bias conductor 530. The current mirror structure, including the tail current bias voltage VTC, controls the amount of current flowing through transistor 546. The current flowing through transistor 546 is provided to varactors 534 and 536 and inductors 538 and 540 to replace lost energy and set the amplitudes of output signals OUTPUT1 and OUTPUT2.

In operation of VCO core 522, when output signal OUTPUT1 is high relative to output signal OUTPUT2, transistor 544 is biased to conduct less current and transistor 542 is biased to conduct more current. Current flowing through transistor 546 charges output conductor 526 through transistor 542. The amplitude of output signal OUTPUT1 on output conductor 526 is related to the current flowing through transistor 546. Larger currents provide larger output signal OUTPUT1 amplitudes. Smaller currents provide smaller output signal OUTPUT1 amplitudes.

As VCO core 522 oscillates, output conductor 526 discharges and output conductor 528 charges to provide a low output signal OUTPUT1 relative to a high output signal OUTPUT2. Transistor 544 is biased to conduct more current and transistor 542 is biased to conduct less current. Current flowing through transistor 546 charges output conductor 528 through transistor 544. The amplitude of output signal OUTPUT2 on output conductor 528 is related to the current flowing through transistor 546. Larger currents provide larger output signal OUTPUT2 amplitudes. Smaller currents provide smaller output signal OUTPUT2 amplitudes. ACC 524 receives the output signals OUTPUT1 and OUTPUT2 and, in a feedback loop, provides the tail current bias voltage VTC and the current flowing through transistor 546, which sets the amplitudes of output signals OUTPUT1 and OUTPUT2.

To receive the output signals OUTPUT1 and OUTPUT2, ACC 524 includes DC blocking capacitors 554 and 556 coupled to NMOS differential pair transistors 558 and 560 and resistors 562 and 564 that are coupled to NMOS transistor 566. One side or terminal of capacitor 554 is electrically coupled to VCO core 522 via output conductor 526, and one side or terminal of capacitor 556 is electrically coupled to VCO core 522 via output conductor 528. The other terminal of capacitor 554 is electrically coupled to the gate of transistor 558 and one terminal of resistor 562 via conductive path 568. The other terminal of capacitor 556 is electrically coupled to the gate of transistor 560 and one terminal of resistor 564 via conductive path 570. The other terminals of resistors 562 and 564 are electrically coupled to the gate and one side of the drain-source path of transistor 566 via conductive path 572. The other side of the drain-source path of transistor 566 is electrically coupled to a reference, such as ground, at 574.

The drain-source paths of transistors 558 and 560 are electrically coupled on one side via conductive path 580 and on the other side via conductive path 576. Conductive path 576 is electrically coupled to a reference, such as ground, at 578.

AC components of output signals OUTPUT1 and OUTPUT2 pass through capacitors 554 and 556 to the gates of transistors 558 and 560. Capacitor 554 blocks DC components of output signal OUTPUT1 on output conductor 526, and capacitor 556 blocks DC components of output signal OUTPUT2 on output conductor 528. The gate of transistor 558 receives AC components of output signal OUTPUT1 via conductive path 568, and the gate of transistor 560 receives AC components of output signal OUTPUT2 via conductive path 570.

Transistor 566 is a diode-connected transistor that provides a DC voltage VDC on conductive path 572. Transistor 566 is biased near threshold voltage to provide about the threshold voltage as the DC voltage VDC on conductive path 572. The DC voltage VDC on conductive path 572 is provided through resistors 562 and 564 to conductive paths 568 and 570. The AC components of output signal OUTPUT1 on conductive path 568 oscillates around the voltage provided through resistor 562, and the AC component of output signal OUTPUT2 on conductive path 570 oscillates around the voltage provided through resistor 564.

The AC components of the output signals OUTPUT1 and OUTPUT2 are out of phase with one another. As the signal on conductive path 568 transitions high relative to the signal on conductive path 570, transistor 560 is biased to conduct less current and transistor 558 is biased to conduct more current provided via conductive path 580. The current flows through transistor 558 to conductive path 576 and the reference at 578. As the signal on conductive path 568 transitions low relative to the signal on conductive path 570, transistor 558 is biased to conduct less current and transistor 560 is biased to conduct more current provided via conductive path 580. The current flows through transistor 560 to conductive path 576 and the reference at 578. In one embodiment, where the AC components of output signals OUTPUT1 and OUTPUT2 are essentially symmetrical and 180 degrees out of phase with one another, transistor 558 is biased to conduct more current for about half the time and transistor 560 is biased to conduct more current for the other half of the time.

ACC 524 includes a capacitor 582, an NMOS transistor 584, PMOS transistors 586 and 587, and a current limiting device 581. Transistors 558 and 560 are electrically coupled to one side or terminal of capacitor 582, the gate of transistor 584, and one side of the drain-source path of transistor 586 via conductive path 580. The other side of the drain-source path of transistor 586 is electrically coupled to power supply voltage VDD via power conductive path 532, and the other terminal of capacitor 582 is electrically coupled to a reference, such as ground, at 588.

Transistor 586 is part of a current mirror that provides a programmed amount of current to capacitor 582 and transistors 558 and 560. The amount of current conducted by transistors 558 and 560 is related to the strength and duration of the bias on each of the transistors 558 and 560, which is related to the amplitudes of output signals OUTPUT1 and OUTPUT2. If the programmed amount of current supplied through transistor 586 is larger than the current conducted by transistors 558 and 560, capacitor 582 charges to a higher voltage. If the programmed amount of current supplied through transistor 586 is less than the current conducted by transistors 558 and 560, capacitor 582 discharges to a lower voltage. The resulting signal on conductive path 580 is filtered and integrated by capacitor 582 to provide a near-DC voltage on conductive path 580 at the gate of transistor 584. The near-DC voltage on conductive path 580 is related to the amplitudes of output signals OUTPUT1 and OUTPUT2.

Transistor 584 is biased by the voltage signal on conductive path 580. One side of the drain-source path of transistor 584 is electrically coupled to one terminal of current limiting device 581 via conductive path 583. The other side of the drain-source path of transistor 584 is electrically coupled to the gate of transistor 546 and the gate and one side of the drain-source path of transistor 587 via tail current bias conductor 530. The other side of the drain-source path of transistor 587 is electrically coupled to power supply voltage VDD via power conductive path 532, and the other terminal of current limiting device 581 is electrically coupled to a reference, such as ground, at 585.

Transistors 587 and 546 are coupled in a current mirror structure. The voltage signal on conductive path 580 biases transistor 584 to control the amount of current supplied through transistor 587 and the amplitude of the tail current bias voltage VTC on conductive path 530. The amount of current supplied through transistor 587 is mirrored through transistor 546 and provided to the rest of VCO core 522 to set the amplitudes of output signals OUTPUT1 and OUTPUT2. Current limiting device 581 bounds the upper limit of the current supplied through transistor 587, which bounds the upper limit of the current supplied through transistor 546 and the upper limit of the amplitudes of output signals OUTPUT1 and OUTPUT2. Current limiting device 581 can be any suitable current limiting device, such as a resistor.

ACC 524 includes a PMOS transistor 590, an NMOS transistor 594, a current source 596, and a resistor 592. Transistors 586 and 590 are coupled in a current mirror structure. The gate of transistor 586 is electrically coupled to the gate and one side of the drain-source path of transistor 590 and to one side of the drain-source path of transistor 594 via conductive path 591. The other side of the drain-source path of transistor 590 is electrically coupled to the power supply voltage VDD via power conductive path 532, and the other side of the drain-source path of transistor 594 is electrically coupled to a reference, such as ground, at 600. In one embodiment, all references at 574, 578, 585, and 600 are the same voltage. In one embodiment, all references at 574, 578, 585, and 600 are electrically coupled to ground.

The gate of transistor 594 is electrically coupled to one side of current source 596 and to one terminal of resistor 592 via conductive path 602. The other side of current source 596 is electrically coupled to power supply voltage VDD via power conductive path 532, and the other terminal of resistor 592 is electrically coupled to the gate and drain-source path of transistor 566 via conductive path 572.

Current source 596 provides current through resistor 592 and transistor 566 to the reference at 574. The current through resistor 592 and transistor 566 creates a voltage VRG on conductive path 602. Transistor 566 is the diode-connected transistor that provides DC voltage VDC on conductive path 572. The voltage VRG is equal to the DC voltage VDC plus the voltage across resistor 592, and is proportional to the resistance value of resistor 592.

In one embodiment, resistor 592 is a poly-silicon resistor and current from current source 596 is derived from a band-gap reference voltage divided by a current sink poly-silicon resistor. The resistance value of resistor 592 and the resistance value of the current sink poly-silicon resistor change together to ensure a constant voltage across resistor 592 over process, voltage and temperature changes. In one embodiment, resistor 592 is a variable resistor, such as a programmable resistor similar to the programmable resistor of FIGS. 2 and 3, and the resistance value of resistor 592 is changed to change the voltage VRG. In one embodiment, resistor 592 has a constant resistance value and current through current source 596 is varied to change the voltage VRG.

Transistors 590 and 586 are coupled in a current mirror structure. The voltage VRG biases transistor 594 to conduct current that flows through transistors 590 and 594 to the reference at 600. The current that flows through transistor 590 is mirrored through transistor 586 and supplied to capacitor 582 and transistors 558 and 560.

If the current supplied through transistor 586 is larger than the current conducted by transistors 558 and 560, capacitor 582 charges to a higher voltage. The higher voltage at the gate of transistor 584, biases transistor 584 to conduct more current and provide a larger current to VCO core 22. The larger current in VCO core 22 increases the amplitudes of the output signals OUTPUT1 and OUTPUT2, which increases the amount of current conducted by transistors 558 and 560.

If the current supplied through transistor 586 is smaller than the current conducted by transistors 558 and 560, capacitor 582 discharges to a lower voltage. The lower voltage at the gate of transistor 584, biases transistor 584 to provide a smaller current to VCO core 22. The smaller current in VCO core 22 decreases the amplitudes of the output signals OUTPUT1 and OUTPUT2, which decreases the amount of current conducted by transistors 558 and 560. In steady state, the average DC current conducted by transistors 558 and 560 is equal to the current supplied through transistor 586.

The amplitudes, such as the peak-to-peak amplitudes, of the output signals OUTPUT1 and OUTPUT2 are set by adjusting the reference current IREF through transistor 586. If the reference current IREF is decreased, the amplitudes of the output signals OUTPUT1 and OUTPUT2 are decreased. This decreases the current conducted by transistors 558 and 560. If the reference current IREF is increased, the amplitudes of the output signals OUTPUT1 and OUTPUT2 are increased. This increases the current conducted by transistors 558 and 560.

The reference current IREF is set by adjusting the resistance value of resistor 592. If the resistance value of resistor 592 is raised, voltage VRG increases to bias transistor 594 to conduct more current, which increases the reference current IREF. If the resistance value of resistor 592 is lowered, voltage VRG decreases to bias transistor 594 to conduct less current, which decreases the reference current IREF. Raising the resistance value of resistor 592 increases the reference current IREF and the amplitudes of the output signals OUTPUT1 and OUTPUT2. Lowering the resistance value of resistor 592 decreases the reference current IREF and the amplitudes of the output signals OUTPUT1 and OUTPUT2.

Figure 8:
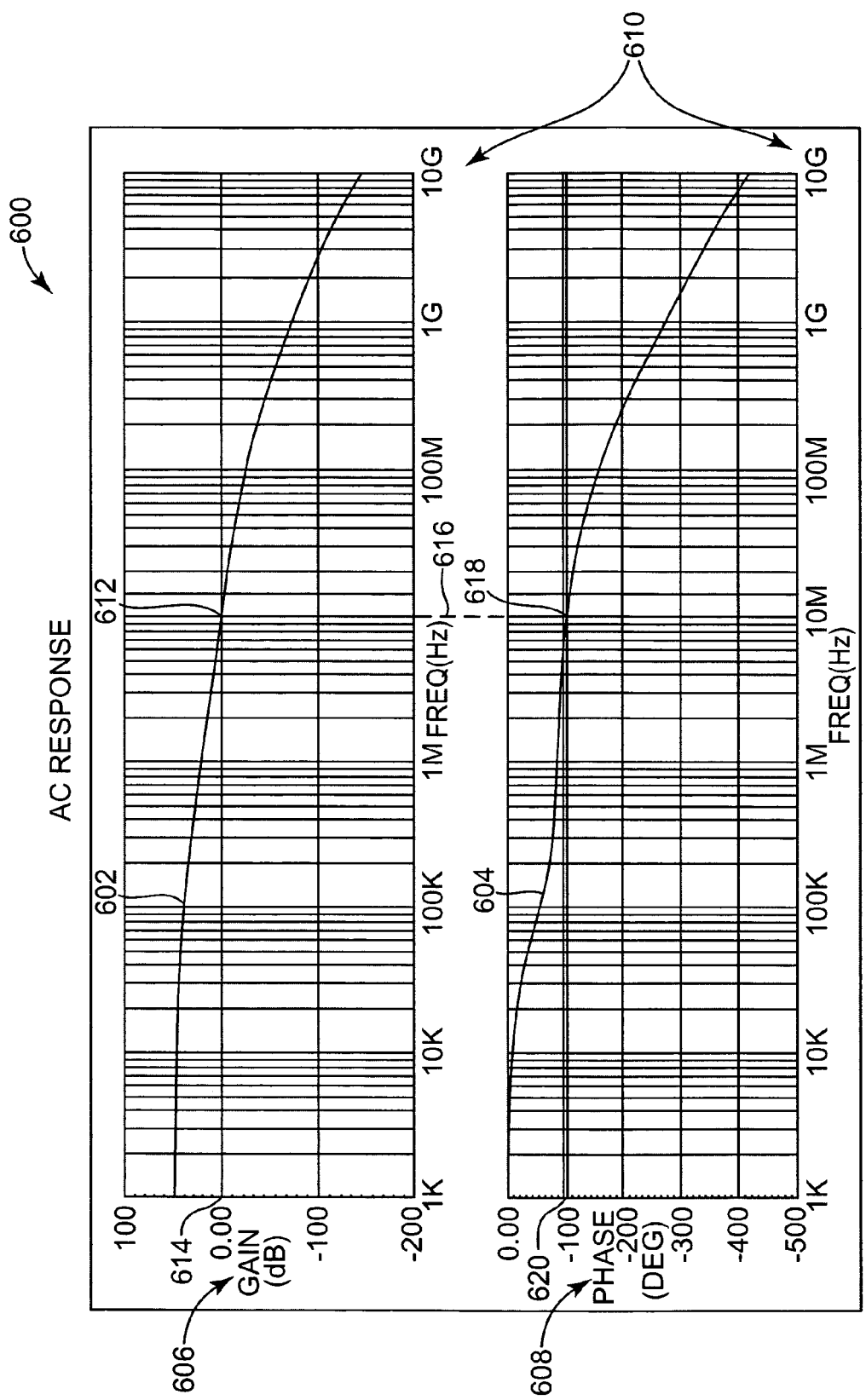
FIG. 8 is a graph illustrating the open-loop AC response of one embodiment of an amplitude control circuit.

FIG. 8 is a graph illustrating the open-loop AC response 600 of one embodiment of ACC 24 (shown in FIG. 1). The graphed embodiment of ACC 24 includes amplifier circuitry 200 of FIG. 4 in place of amplifier circuitry 89. AC response 600 includes a gain plot 602 and a phase plot 604. Gain plot 602 plots the gain versus frequency response and phase plot 604 plots the phase versus frequency response. The gain at 606 is graphed in units of decibels (dB) along the y-axis and the phase at 608 is graphed in units of degrees along the y-axis. The frequency at 610 is graphed in units of hertz (HZ) in a logarithmic scale along the x-axis.

Phase margin is one measure of stability for ACC 24. Phase margin is the phase difference between the phase at a gain of one and a phase of negative 180 degrees. At 612, gain plot 602 crosses the gain of one or 0 dB's, indicated at 614. The crossing frequency, of about 10 MHZ, is traced at 616 to phase plot 604. At 618, phase plot 604 crosses the traced frequency at a phase of negative 107 degrees, indicated at 620. The difference between negative 107 degrees and negative 180 degrees is a phase margin of positive 73 degrees, which indicates ACC 24 is stable.

Table I includes time domain results over various process, voltage, and temperature (PVT) situations for one embodiment of ACC 24 that includes amplifier circuitry 200. Five processes are included in the time domain results and indicated as TT, FF, SS, FS, and SF processes. Voltage is varied from 1.08 volts to 1.32 volts, or 1.2 volts plus or minus 10 percent. Temperatures include 0 degrees centigrade, 75 degrees centigrade, and 125 degrees centigrade.

TABLE I

| Time-Domain Results (P; V; T) | VR92 (mV) | Selected Amplitude - A (mV) | Oscillation Amplitude - A (mV) | Variation |
|---|---|---|---|---|
| TT; 1.2 V; 75° C. | 141 | 200 | 201 | ~±1.5% |
| FF; 1.32 V; 0° C. | | | 202 | |
| SS; 1.08 V; 125° C. | | | 197 | |
| FS; 1.2 V; 75° C. | | | 196 | |
| SF; 1.2 V; 75° C. | | | 202 | |
| FF; 1.08 V; 125° C. | | | 196 | |
| SS; 1.32 V; 0° C. | | | 203 | |

Resistor 92 (shown in FIG. 1) is set to obtain a voltage across resistor 92 (VR92) of 141 millivolts and a selected amplitude—A of 200 millivolts. The resulting oscillation amplitudes—A of output signals OUTPUT1 and OUTPUT2 are between a low of about 196 millivolts and a high of about 203 millivolts, or a variation of about plus or minus 1.5 percent.

Table II includes stability analysis results over PVT, variations in the band gap (BG) voltage, and variations in resistor 92 for one embodiment of ACC 24 that includes amplifier circuitry 200. The BG voltage is used to provide the current source 96 (shown in FIG. 1). Three processes are included in the stability analysis results and indicated as TT, FF, and SS processes. Voltage is varied from 1.08 volts to 1.32 volts, or 1.2 volts plus or minus 10 percent. Temperatures include 0 degrees centigrade, 75 degrees centigrade, and 125 degrees centigrade. Also, BG variations include 0 percent, plus 5 percent, and minus 5 percent, and variations of resistor 92 are indicated as RN, RL, and RH resistors.

TABLE II

| Stability Analysis (P; V; T; BG; R) | Open Loop Gain (dB) | Phase Margin | Closed Loop BW (MHz) |
|---|---|---|---|
| TT; 1.2 V; 75° C.; BG 0%; RN | 46 | 81° | 17 |
| FF; 1.32 V; 0° C.; BG +5%; RL | 52 | 82° | 21 |
| SS; 1.08 V; 125° C.; BG −5%; RH | 48 | 73° | 18 |

The open loop gain ranges from 46 dB to 52 dB. The phase margin ranges from 73 degrees to 82 degrees, and the closed loop band width (BW) varies between 17 and 21 megahertz (MHZ).

Figures 9A, 9B:
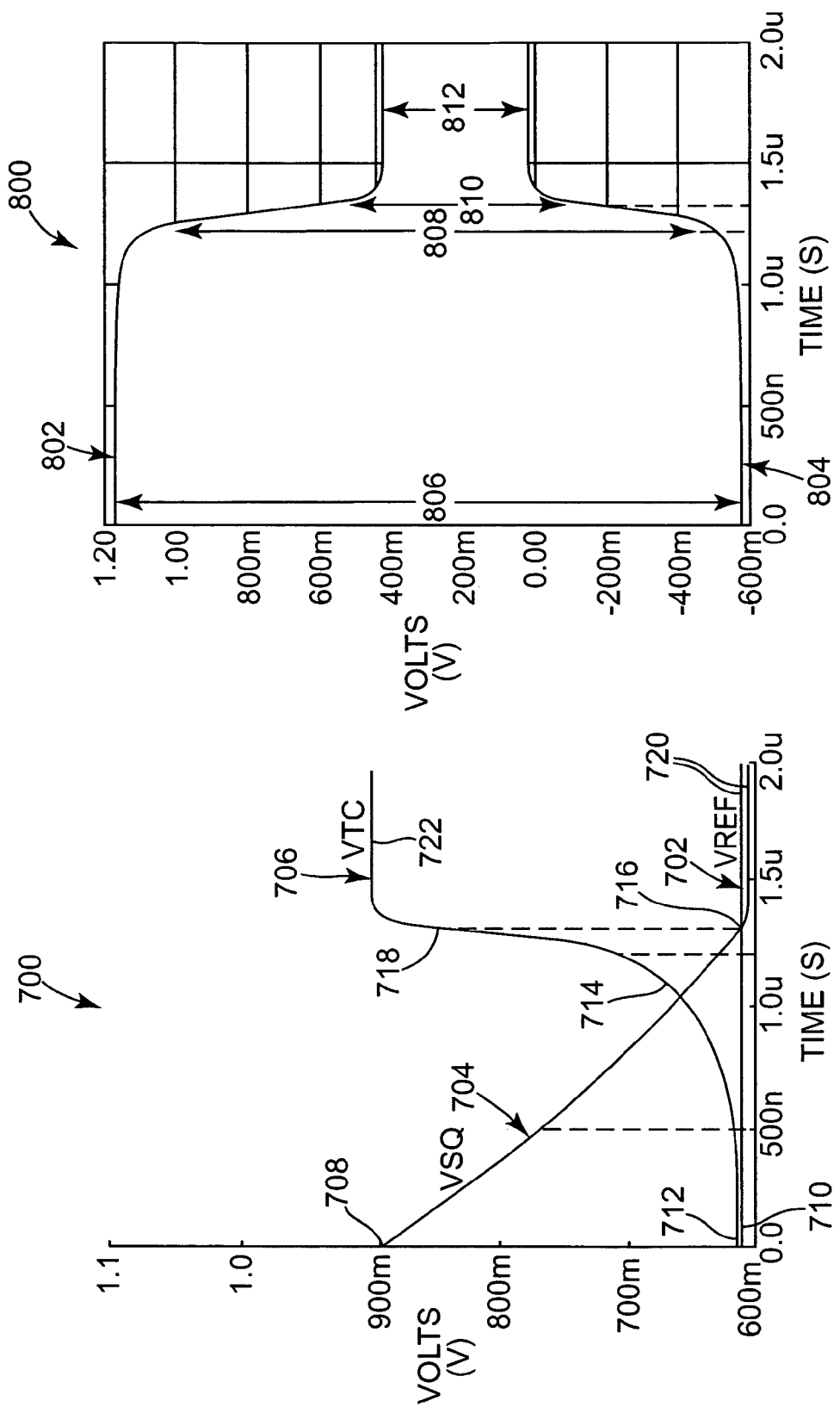
FIG. 9A is a graph illustrating transient responses at startup of one embodiment of an amplitude control circuit.
FIG. 9B is a graph illustrating the peak-to-peak voltage swing of each of the differential output signals at startup of one embodiment of an amplitude control circuit.

FIGS. 9A and 9B are graphs illustrating transient responses at start up of one embodiment of ACC 24 (shown in FIG. 1) that includes amplifier circuitry 200 (shown in FIG. 4). FIG. 9A is a graph 700 illustrating the reference voltage VREF at 702, the voltage signal VSQ at 704, and tail current bias voltage VTC at 706. Voltages 702, 704, and 706 are plotted versus time, with units of volts (V) along the y-axis and units of time in seconds (S) along the x-axis. FIG. 9B is a graph 800 illustrating the peak-to-peak voltage swing of each of the differential output signals OUTPUT1 and OUTPUT2. Plot lines 802 and 804 outline the voltage envelope of the peak-to-peak voltage swing. Plot line 802 outlines the maximum voltage and plot line 804 outlines the minimum voltage. Plot lines 802 and 804 are plotted versus time, with units of volts (V) along the y-axis and units of time in seconds (S) along the x-axis.

At start up, VCO core 22 is not oscillating and transistors 58 and 60 are biased at about the threshold voltage $V_T$ to conduct a small amount of current through resistor 82. The resulting voltage signal VSQ 704 is about 900 millivolts at 708. Reference voltage VREF 702 is set to about 600 millivolts at 710.

Amplifier circuitry 200 provides tail current bias voltage VTC 706, which is clamped by clamping circuit 226 to a voltage of 620 millivolts at 712. The tail current bias voltage VTC 706 at 712 biases transistor 46 to provide a maximum current flow through transistor 46 to the rest of VCO core 22. VCO core 22 begins oscillating and provides the maximum peak-to-peak voltage swing of output signals OUTPUT1 and OUTPUT2 at 806. Plot line 802 indicates the maximum voltage of the peak-to-peak voltage swing is about 1.2 volts and plot line 804 indicates the minimum voltage of the peak-to-peak voltage swing is about minus 600 millivolts. The peak-to-peak voltage swing is about plus or minus 900 millivolts or about 1.8 volts, from minus 600 millivolts to plus 1.2 volts.

The output signals OUTPUT1 and OUTPUT2 are provided to ACC 24 and transistors 58 and 60 to increase current flow through transistors 58 and 60. The increased current flow lowers voltage signal VSQ 704 toward reference voltage 702. As long as voltage signal VSQ 704 is greater than reference voltage VREF 702, amplifier circuitry 200 provides a low tail current bias voltage VTC 706 to transistor 46 that provides a large current to the rest of VCO core 22. The large current maintains the large peak-to-peak voltage swing of output signals OUTPUT1 and OUTPUT2, which is provided to transistors 58 and 60 to further lower voltage signal VSQ 704 toward reference voltage VREF 702.

As voltage signal VSQ 704 approaches reference voltage VREF 702, such as between 500 nanoseconds and 1.2 microseconds after start up, amplifier circuitry 200 provides an increasing tail current bias voltage VTC 706 at 714. The increasing tail current bias voltage VTC 706 at 714 biases transistor 46 to provide a reduced current to VCO core 22. The reduced current decreases the peak-to-peak voltage swing and amplitudes of output signals OUTPUT1 and OUTPUT2, indicated at 808. The decreased peak-to-peak voltage swings of output signals OUTPUT1 and OUTPUT2 at 808 are provided to transistors 58 and 60 to decrease current flow through transistor 58 and 60.

As voltage signal VSQ 704 crosses reference voltage VREF 702 at 716, amplifier circuitry 200 provides a larger and increasing tail current bias voltage VTC 706 at 718. The larger and increasing tail current bias voltage VTC 706 at 718 biases transistor 46 to provide a reduced current to VCO core 22. The reduced current decreases the peak-to-peak voltage swing and amplitudes of output signals OUTPUT1 and OUTPUT2, indicated at 810. The decreased peak-to-peak voltage swings of output signals OUTPUT1 and OUTPUT2 at 810 are provided to transistors 58 and 60 to decrease current flow through transistor 58 and 60 and stop the decrease in voltage signal VSQ 704 at about the same level as reference voltage VREF 702.

In steady state, voltage signal VSQ 704 is at about the same level as reference voltage VREF 702, indicated at 720, and amplifier circuitry 200 provides tail current bias voltage VTC 706, indicated at 722. The tail current bias voltage VTC 706 at 722 biases transistor 46 to provide a current to VCO core 22 that provides the peak-to-peak voltage swing and amplitudes of output signals OUTPUT1 and OUTPUT2, indicated at 812. The peak-to-peak voltage swings of output signals OUTPUT1 and OUTPUT2 at 812 are provided to transistors 58 and 60 to provide current flow that maintains voltage signal VSQ 704 at about the same level as reference voltage VREF 702.

Plot line 802 indicates the maximum voltage of the peak-to-peak voltage swing at 812 is about 400 millivolts and plot line 804 indicates the minimum voltage of the peak-to-peak voltage swing at 812 is about 0 volts. The peak-to-peak voltage swing at 812 is about plus or minus 200 millivolts or about 400 millivolts, from 0 to 400 millivolts.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An amplitude control circuit comprising:
    a first circuit configured to receive differential signals and provide a first signal based on the amplitudes of the differential signals;
    a second circuit configured to receive a bias signal and provide a second signal based on the bias signal; and
    a third circuit configured to provide bias to the first circuit and the bias signal to the second circuit, wherein the bias signal is set to provide selected amplitudes of the differential signals.

2. The amplitude control circuit of claim 1, wherein the third circuit comprises a poly-silicon resistor.

3. The amplitude control circuit of claim 2, wherein the poly-silicon resistor is configured to receive a current to provide a voltage across the poly-silicon resistor that is part of the bias signal.

4. The amplitude control circuit of claim 1, wherein the third circuit comprises a programmable resistor configured to adjust the bias signal.

5. The amplitude control circuit of claim 4, wherein the programmable resistor receives a current to provide a voltage across the programmable resistor that is part of the bias signal.

6. The amplitude control circuit of claim 1, wherein the third circuit comprises a current source including a band gap reference with a poly-silicon resistor.

7. The amplitude control circuit of claim 1, wherein the first circuit comprises a differential pair of transistors configured to be biased at about the threshold voltage by the third circuit.

8. The amplitude control circuit of claim 1, wherein the second circuit comprises a transistor configured to be biased by the bias signal to conduct current through a resistor and provide the second signal.

9. The amplitude control circuit of claim 1, wherein the second circuit comprises a transistor configured to be biased by the bias signal to conduct current through a current mirror and provide the second signal.

10. The amplitude control circuit of claim 1, comprising a fourth circuit configured to receive the first signal and the second signal and provide a third signal based on the difference between the first signal and the second signal, wherein the third signal controls current through a current mirror to set the amplitudes of the differential signals.

11. The amplitude control circuit of claim 10, wherein the fourth circuit includes a current limiting device configured to limit the current through the current mirror.

12. The amplitude control circuit of claim 1, comprising a differential amplifier configured to receive the first signal and the second signal and provide a third signal based on the difference between the first signal and the second signal, wherein the third signal controls the amplitudes of the differential signals.

13. The amplitude control circuit of claim 1, comprising a differential amplifier including a clamping circuit, wherein the differential amplifier is configured to receive the first signal and the second signal and provide a third signal based on the difference between the first signal and the second signal and the clamping circuit is configured to limit a lower value of the third signal.

14. The amplitude control circuit of claim 1, comprising a differential amplifier including an input configured to receive the first signal, wherein the differential amplifier is configured to have a dominant pole at the input.

15. The amplitude control circuit of claim 1, comprising a differential amplifier including an output configured to provide a third signal, wherein the differential amplifier is configured to have a dominant pole at the output.

16. A voltage controlled oscillator comprising:
a first circuit configured to provide oscillating differential signals;
a second circuit configured to receive the oscillating differential signals and provide a first signal based on the amplitudes of the oscillating differential signals;
a third circuit configured to receive the first signal and a reference signal and provide a second signal based on a comparison of the first signal and the reference signal; and
a fourth circuit configured to provide the reference signal to the third circuit and a direct current bias voltage to the second circuit, wherein the reference signal is adjusted to provide selected amplitudes of the oscillating differential signals.

17. The voltage controlled oscillator of claim 16, wherein the fourth circuit provides an adjustable signal that adjusts the reference signal, wherein the adjustable signal is scaled for low voltage operation.

18. The voltage controlled oscillator of claim 16, wherein the fourth circuit provides an adjustable signal that adjusts the reference signal, wherein the adjustable signal is about equal to the selected amplitudes of the differential signals divided by the square root of 2.

19. The voltage controlled oscillator of claim 16, wherein the reference signal is one of a reference voltage provided via a resistor and a reference current provided via a current mirror.

20. The voltage controlled oscillator of claim 16, wherein the first circuit comprises a transistor configured to be biased by the second signal to provide current to the first circuit.

21. The voltage controlled oscillator of claim 16, wherein the first circuit comprises a tail current transistor and the third circuit comprises a current mirror transistor, wherein the tail current transistor and the current mirror transistor are configured in a current mirror to provide current to the first circuit.

22. An amplitude control circuit comprising:
a first circuit configured to receive a first signal and a second signal and provide a third signal based on the amplitudes of the first signal and the second signal;
a second circuit configured to receive a bias signal and provide a fourth signal based on the bias signal;
a third circuit configured to receive the third signal and the fourth signal and provide a fifth signal to control the amplitudes of the first signal and the second signal; and
a fourth circuit comprising a programmable resistor that is programmed to a selected resistance value to provide a selected voltage across the programmable resistor to obtain selected amplitudes of the first signal and the second signal, wherein the fourth circuit is configured to provide the bias signal to the second circuit and the voltage across the programmable resistor is part of the bias signal.

23. The amplitude control circuit of claim 22, wherein the voltage across the programmable resistor is equal to one of the selected amplitudes of the first signal and the second signal divided by the square root of two.

24. The amplitude control circuit of claim 22, wherein the first signal and the second signal are out-of-phase oscillating signals.

25. The amplitude control circuit of claim 22, wherein the fourth circuit comprises a diode-connected transistor configured to provide a bias voltage of about a threshold voltage to the first circuit and the bias signal comprises the bias voltage plus the selected voltage across the programmable resistor.

26. The amplitude control circuit of claim 25, wherein the second circuit comprises a transistor configured to conduct current through a resistor to provide the fourth signal.

27. The amplitude control circuit of claim 25, wherein the second circuit comprises a transistor configured to conduct current through a current mirror to provide the fourth signal.

28. An amplitude control circuit comprising:
means for providing a first signal based on amplitudes of signals;
means for providing a bias voltage to the means for providing a first signal;
means for providing a bias signal that includes the bias voltage;
means for adjusting the bias signal to provide selected amplitudes of the signals; and means for providing a second signal based on the bias signal.

29. The amplitude control circuit of claim 28, wherein the means for adjusting comprises;
    means for supplying a current to a resistor network; and
    means for switching in and out resistive elements of the resistor network.

30. The amplitude control circuit of claim 28, comprising:
    means for comparing the first signal and the second signal to obtain an output; and
    means for setting the amplitudes of the signals based on the output.

31. The amplitude control circuit of claim 30, wherein the means for comparing comprises:
    means for limiting the output.

32. The amplitude control circuit of claim 30, wherein the means for setting the amplitudes comprises:
    means for conducting current through a current mirror.

33. A method of controlling signal amplitudes comprising:
    receiving a bias voltage and differential signals at a first circuit;
    providing a first signal based on amplitudes of the received differential signals;
    receiving a bias signal that includes a combination of the bias voltage and at least one voltage across a passive component at a second circuit; and
    providing a second signal based on the bias signal.

34. The method of claim 33 comprising:
    comparing the first signal to the second signal; and
    providing a third signal based on the comparison to control the amplitudes of the differential signals.

35. The method of claim 33, wherein receiving a bias voltage and differential signals comprises:
    blocking direct current components of the differential signals; and
    receiving alternating components of the differential signals at a pair of differential transistors.

36. The method of claim 33, wherein providing the second signal comprises:
    biasing a transistor to control current through a resistor.

37. The method of claim 33, wherein providing the second signal comprises:
    biasing a transistor to control current through a current mirror.

38. A method of controlling signal amplitudes comprising:
    receiving a bias voltage and differential signals at a first circuit;
    providing a first signal based on amplitudes of the received differential signals;
    receiving a bias signal that includes the bias voltage at a second circuit;
    providing a second signal based on the bias signal;
    selecting a resistance value for a resistor; and
    providing the bias signal based on the bias voltage and the selected resistance value.

39. The method of claim 38, wherein providing the bias signal comprises:
    providing a current to the resistor.

* * * * *